(12) United States Patent
Vijh

(10) Patent No.: US 11,356,052 B2
(45) Date of Patent: Jun. 7, 2022

(54) ENERGY DEVICE FOR USE IN ELECTRONIC DEVICES

(71) Applicant: UTICA LEASECO, LLC, Rochester Hills, MI (US)

(72) Inventor: Aarohi Surya Vijh, Cupertino, CA (US)

(73) Assignee: UTICA LEASECO, LLC, Rochester Hills, MI (US)

( * ) Notice: Subject to any disclaimer, the term of this patent is extended or adjusted under 35 U.S.C. 154(b) by 75 days.

(21) Appl. No.: 16/264,324

(22) Filed: Jan. 31, 2019

(65) Prior Publication Data

US 2020/0252025 A1 Aug. 6, 2020

(51) Int. Cl.
- *H02S 30/00* (2014.01)
- *H02S 40/30* (2014.01)
- *H02S 10/20* (2014.01)

(52) U.S. Cl.
CPC ............. *H02S 30/00* (2013.01); *H02S 10/20* (2014.12); *H02S 40/30* (2014.12)

(58) Field of Classification Search
CPC .......... H02S 30/00; H02S 10/20; H02S 40/30; H02S 40/38; H01L 31/02008; H01L 31/042; H01L 31/048
See application file for complete search history.

(56) References Cited

U.S. PATENT DOCUMENTS

| | | | |
|---|---|---|---|
| 2,181,494 A | 11/1939 | Nix | |
| 2,875,308 A | 2/1959 | Tarbes | |
| 2,931,847 A | 4/1960 | Dahlstrom et al. | |
| 3,178,621 A | 4/1965 | Glickman | |
| 5,922,489 A | 7/1999 | Adachi | |
| 6,791,905 B1* | 9/2004 | Sekiguchi | ............ G04G 9/0082 368/80 |
| 7,235,736 B1 | 6/2007 | Buller et al. | |
| 9,491,271 B2 | 11/2016 | Olah | |
| 2008/0223429 A1 | 9/2008 | Everett et al. | |
| 2008/0230117 A1* | 9/2008 | Katayama | .............. B23K 3/087 136/252 |
| 2015/0287848 A1 | 10/2015 | Jun | |

(Continued)

OTHER PUBLICATIONS

International Search Report and Written Opinion corresponding to International Application No. PCT/US20/16029, dated Apr. 30, 2020.

*Primary Examiner* — Mayla Gonzalez Ramos
(74) *Attorney, Agent, or Firm* — Arentfox Schiff LLP

(57) ABSTRACT

The present disclosure describes an energy device with a solar module having a form factor configured to be inserted into and to match an inner portion of a coin-type cell holder of an electronic device. The solar module includes one or more photovoltaic cells to capture energy from ambient light and a pair of electrodes. The energy device may be configured to provide, to the electronic device via contact with the coin-type cell holder, electric energy produced from the ambient light energy. The solar module may include a converter module to convert the ambient light energy into the electric energy. The energy device may also include an energy storage module and/or a power management module that are stackable below the solar module with electrical connectivity to the solar module, and that combined with the solar module have the appropriate form factor for the coin-type cell holder.

32 Claims, 8 Drawing Sheets

(56) References Cited

U.S. PATENT DOCUMENTS

| | | |
|---|---|---|
| 2016/0154484 A1 | 6/2016 | Kampf |
| 2017/0202514 A1* | 7/2017 | Nousiainen .......... A61B 8/4227 |
| 2019/0049904 A1* | 2/2019 | Lagorgette ................ G06T 7/74 |
| 2019/0163137 A1* | 5/2019 | Nagano ................. H01L 31/042 |
| 2019/0294120 A1* | 9/2019 | Nakajima .............. G04R 60/12 |

* cited by examiner

ENERGY DEVICE FOR USE IN ELECTRONIC DEVICES

TECHNICAL FIELD

This disclosure relates to an energy device, and more specifically, to an energy device having a form factor for inserting the energy device into a coin-type cell holder of an electronic device, and where the energy device is configured to capture ambient light energy to power the electronic device.

BACKGROUND

Many electronic devices, such as certain types of household electronics, including remote controls, for example, as well as other home and industrial devices such as Internet-of-Things (IoT) devices, including meters, sensors, and the like, utilize batteries, such as coin-type cells, to provide the needed energy to power their electronic components. Among electronic devices there is a rapid increase in wireless devices, with some projections indicating as many as 25 billion of such devices deployed by 2020. A significant number of these electronic devices will be powered by primary or secondary cells (e.g., batteries), including the coin-type cells mentioned above.

Once the cells are drained they need to be replaced, and consequently, many of these electronic device require manual intervention in the form of, for example, replacement. Even if the cells are rechargeable, they need to be removed, recharged, and then placed back into the electronic device. These electronic devices are generally designed to operate using 1.5 or 3-volt primary cells and therefore include holders (e.g., coin-type holders or receptacles) in which the cells are placed and that have spring-loaded contacts to more easily insert a new or recharged cell or remove the cell when spent. The need to manually replace or recharge existing cells may be cumbersome and inefficient, particularly when the electronic devices are widely distributed geographically as is the case with IoT devices.

Thus, the need for autonomous or rechargeable power solutions to provide power to different types of electronic devices is expanding. One approach that could avoid the need to replace or remove cells for recharging is the harvesting of energy from ambient light to continuously provide power. Such an approach, however, may be limited because existing, standard components that are already widely used in the electronics industry may not be compatible with devices or components used for energy harvesting (e.g., capturing energy from ambient light). Therefore, the ability to use devices that may capture ambient light, but may also be compatible with existing, standard components such as cell holders, may make the design, manufacturing, installation, operation, and/or maintenance of the electronic devices much simpler.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an aspect, the present disclosure is directed to an energy device. The energy device may include a solar module having a form factor configured to be inserted into and to match an inner portion of a coin-type cell holder or holder of an electronic device. The solar module includes at least one photovoltaic cell configured to capture energy from ambient light. The energy device may also include a pair of electrodes. The energy device may be configured to provide, to the electronic device via contact with the coin-type cell holder, electric energy produced from the ambient light energy.

In another aspect, the present disclosure is directed to an electronic device having a coin-type cell holder with an inner portion, and an energy device having a form factor configured to be inserted into and to match the inner portion of the coin-type cell holder. The energy device may include a solar module having at least one photovoltaic cell configured to capture energy from ambient light. The energy device may also include a pair of electrodes. The energy device may be configured to provide, to the electronic device via contact with the coin-type cell holder, electric energy produced from the ambient light energy. The electronic device may also include a housing within which the energy device and the coin-type cell holder are placed, the housing having a transparent portion for exposing the at least one photovoltaic cell of the solar module to the ambient light. The electronic device may also include a microcontroller configured to control one or more operations of the electronic device, the microcontroller being powered by the electric energy provided by the energy device.

BRIEF DESCRIPTION OF THE DRAWINGS

The novel features believed to be characteristic of aspects of the disclosure are set forth in the appended claims. In the description that follows, like parts are marked throughout the specification and drawings with the same numerals, respectively. The drawing figures are not necessarily drawn to scale and certain figures may be shown in exaggerated or generalized form in the interest of clarity and conciseness. The disclosure itself, however, as well as a preferred mode of use, further objects and advances thereof, will be best understood by reference to the following detailed description of illustrative aspects of the disclosure when read in conjunction with the accompanying drawings, wherein:

DETAILED DESCRIPTION

Figure 1A:
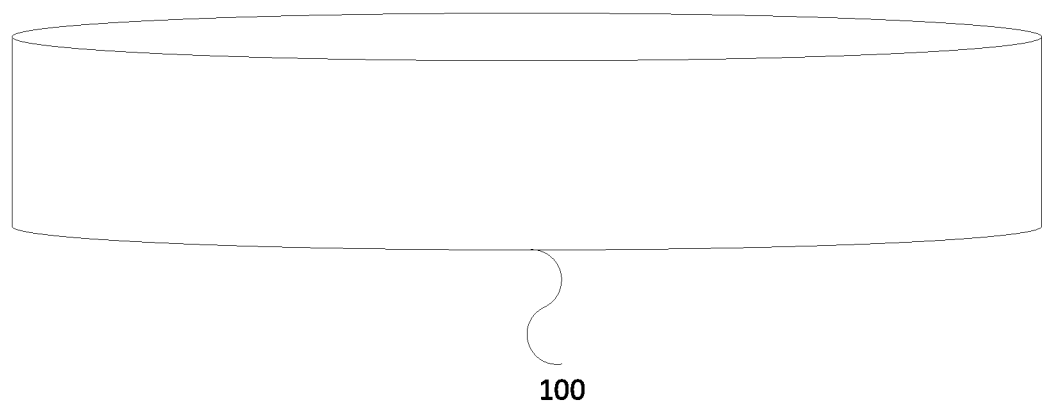
FIGS. 1A-1C illustrate an example energy device, in accordance with aspects of this disclosure.

This disclosure describes various structures, devices, and arrangements that enable the incorporation of an energy device configured to harvest or capture energy from ambient sources (e.g., ambient light) into different electronic devices, and more particularly, into the types of cell or battery holders that are conventionally used through the electronic industry for holding the primary cells used to provide power to electronic devices. For example, the energy device may include one or more photovoltaic elements or cells that may be suitable as a substitute for batteries, e.g., coin-type cells, that are conventionally used in electronic devices, such as a remote control, IoT devices, etc. However, because the use of coin-type cell holders is widespread in the design and manufacturing of electronic devices, and because many of these electronic devices are small or compact in design, the use of an energy device to replace coin-type cells because of its ability to harvest ambient light energy to provide continuous electric energy without the need to be replaced or recharged is constrained by the need to make it work with existing coin-type cell holders. Aspects of this disclosure describe an energy device that has a form factor configured to or suitable for being inserted into and matching an inner portion of a coin-type cell holder so that it may easily substitute a coin-type cell without the drawbacks of having to replace a coin-type cell or remove a coin-type cell for recharging.

As used herein the terms "photovoltaic," "photovoltaic element," "PV," "PV cell," and "solar cell" may be used interchangeably to refer to one or more portions of an optoelectronic system or component that produce voltage and/or electric current when exposed to light. The energy in the light may be referred to "light energy" or "ambient light energy," and the energy resulting from the voltage and/or electric current produced from the light energy may be referred to as "electric energy." It is also to be understood that a reference to a single "photovoltaic," "photovoltaic element," "PV," "PV cell," and "solar cell" may also refer to instances of multiples of such devices or structures. Also, as used herein the terms "light," "lighting," "ambient light," "ambient lighting," and similar terms may refer to light available for harvesting, collecting, or capturing within an indoor or outdoor environment, whether the light that is available is entirely artificially generated, the light that is available is entirely solar in origin, or a combination of both.

In some implementations, the energy device of the present disclosure may be incorporated into existing electronic devices. In some implementations, the energy device may include a pair electrodes and a photovoltaic element, where the electrodes may make physical contact with respective spring-loaded contacts of a typical coin-type cell holder. The energy device may also optionally include one or more of a protective element, an energy storage element, or a power management circuit. In some implementations, the components of the energy device may be arranged to allow exposure of the photovoltaic element to light and to simultaneously allow mechanical and electrical contact by conductors for the extraction of energy. For example, the photovoltaic element that may be mechanically similar (e.g., have a similar form factor including same shape and size) to coin-type cells used in such electronic devices. In this way, the energy device may be readily incorporated into holders designed for the coin-type cells. Additionally, the photovoltaic element may also provide a voltage similar to that provided by coin-type cells. Thus, the mechanical and electrical compatibility of the energy device of the present disclosure enables designers of electronic devices to incorporate the energy device with nominal design changes, such as, for example, a cover that exposes the photovoltaic element to a source of light.

In an aspect, the photovoltaic element may be, but need not be limited to, thin-film GaAs photovoltaic cells, including single-junction and multi-junction GaAs photovoltaic cells. These types of photovoltaic cells may be flexible, lightweight, and highly efficient, which makes them suitable for demanding autonomous power, self-powered, or light-rechargeable applications ranging from indoor light harvesting to spacecraft. Alternatively, the photovoltaic element may be, for example, an amorphous silicon (a-Si)-based solar cell or dye sensitized solar cell.

In another example, the energy device may optionally include an energy storage component or module, such as a battery or a capacitor. In another example, the energy device may optionally include a power management circuit or module. In yet another example, the energy device may include both the energy storage component and the management circuit. In some implementations, the energy device having a storage component or module may function as a rechargeable energy device.

Figure 1B:
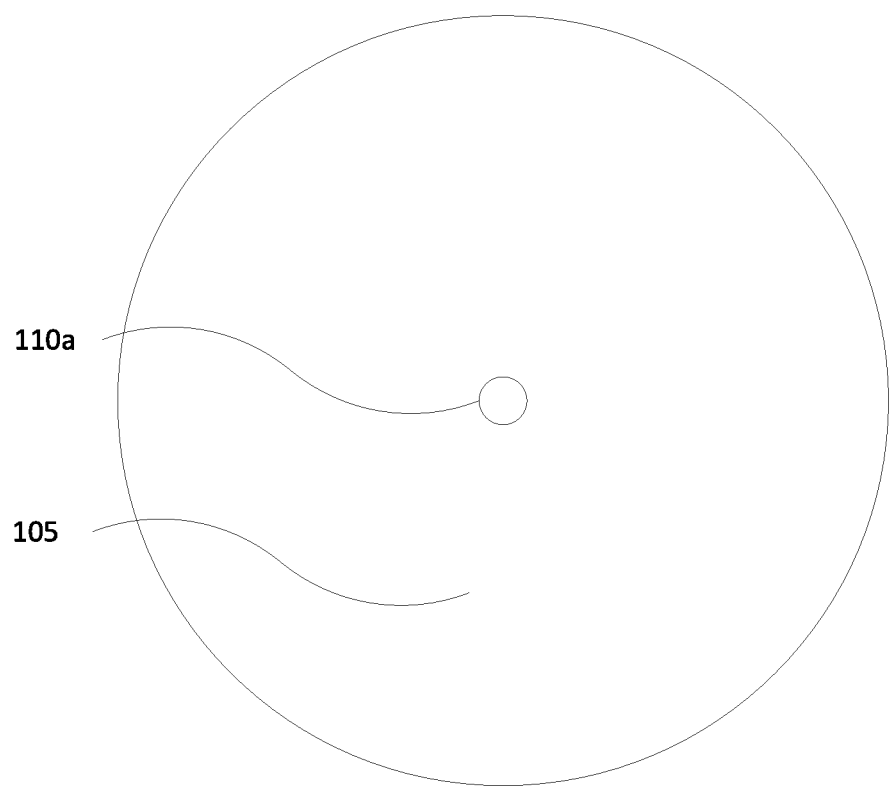
Figure 1C:
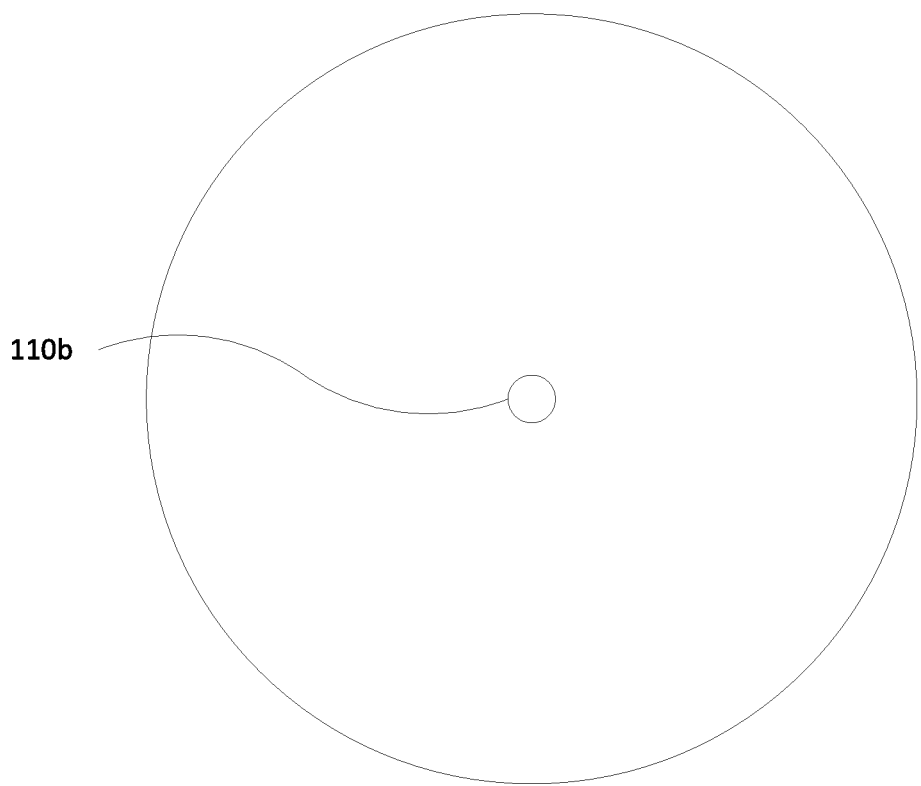
Figure 2:
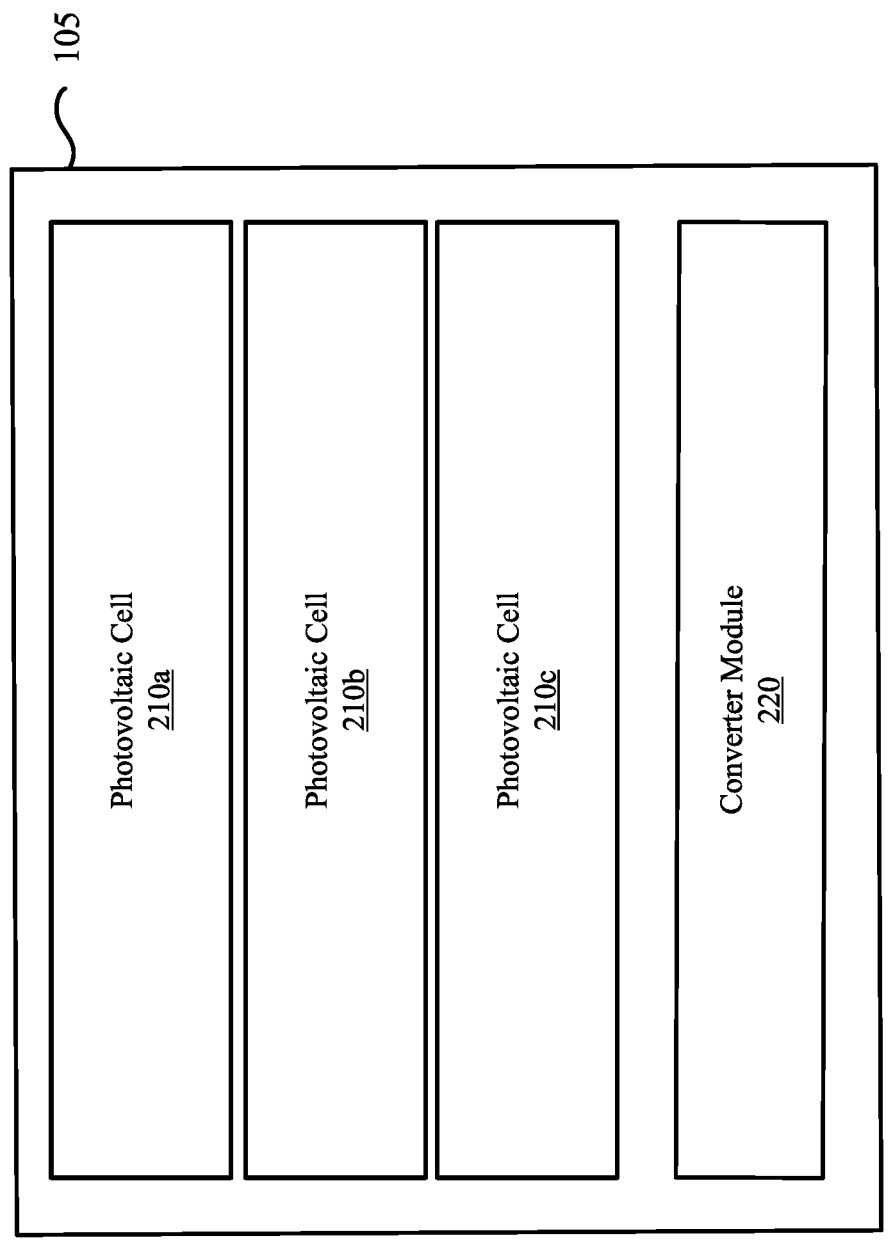
FIG. 2 illustrates a block diagram that illustrates an example architecture of an energy device, in accordance with aspects of this disclosure.
Figure 8:
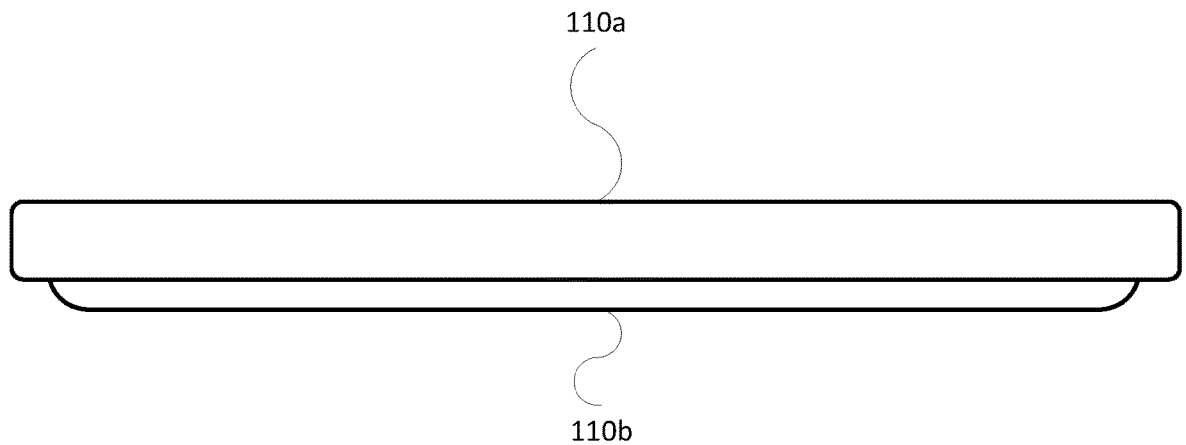
FIG. 8 illustrates another example energy device, in accordance with aspects of this disclosure.

FIGS. 1A-1C illustrate an example energy device 100 that may be used as a replacement for a coin-type cell, in accordance with aspects of this disclosure. In some implementations, the energy device 100 may be recharged from harvesting energy from a light source. The energy device 100 may include a solar module 105 and a pair of electrodes 110a, 110b. Although FIG. 1A illustrates the electrode 110b covering a portion a portion of the solar module 105, it should be understood by those of ordinary skill in the arts that the electrodes 110a, 110b may cover an entire portion of the solar module 105 (as illustrated in FIG. 8). In some implementations, the pair of electrodes 110a, 110b may be geometrically opposing electrodes, electrically opposing electrodes, or both. In some implementations, the solar module 105 may include one or more photovoltaic cells 210a, 210b, and 210c and a converter module 220 coupled to the one or more photovoltaic cells 210a, 210b, and 210c, as illustrated in FIG. 2. In some implementations, the one or more photovoltaic cells 210a, 210b, and 210c may be configured to capture energy from ambient light and the converter module 220 may be configured to convert the ambient light energy captured by the one or more photovoltaic cells 210a, 210b, and 210c into electric energy. For example, the ambient light may be from an artificial source (e.g., lamps, ceiling lights, wall lights) and/or from outdoor light energy (e.g., solar light). In some instances, the available light energy in a particular location and/or time may be mostly or solely from artificial sources.

As illustrated in FIG. 1A, the energy device 100 may be cylindrically shaped, although it should be understood by those of ordinary skill in the arts that other shapes are contemplated in accordance with aspects of the present disclosure. In some implementations, the energy device 100 may have a diameter that is about 24 millimeters (mm), e.g., 24 mm+/−25%. In further implementations, the energy device 100 may have a thickness that is about 5 mm, e.g., 5 mm+/−25%. In further implementations, the energy device 100 may have a diameter that is about 20 mm, e.g., 20 mm+/−25%, and a thickness that is about 3.3 mm, e.g., 3.3 mm+/−25%. It should be understood by those of ordinary skill in the arts that the sizes of the energy device described herein are merely example sizes, and that other sizes are further contemplated in accordance with aspects of the present disclosure.

Figure 3:
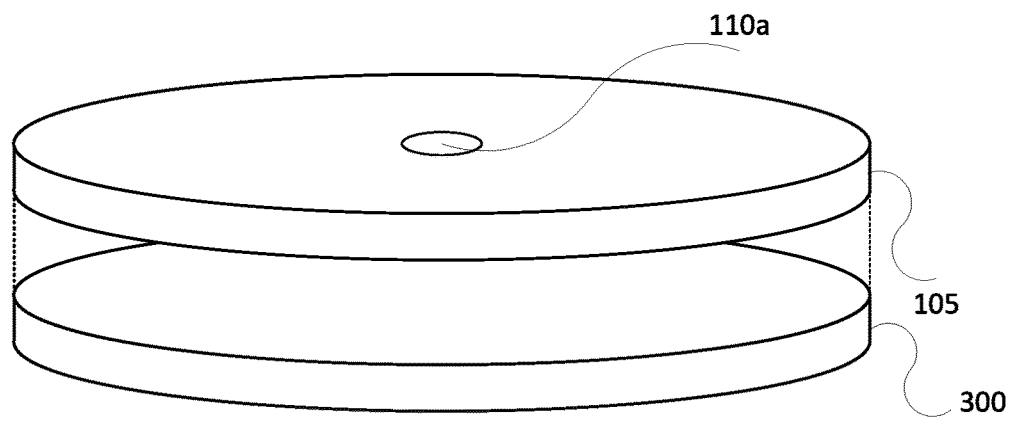
FIG. 3 illustrates another example energy device, in accordance with aspects of this disclosure.

In some implementations, the harvested photovoltaic energy may provide power to an electronic device, such as a remote control, an IoT device, etc. For example, the electronic device may be a Bluetooth low energy device that transmits signals every two minutes with a power of 0 dBm (1 mW) and that may consume as little as 10 µA at 3.3 V, or an average power of 33 microwatts. In some implementations, this power may be harvested using the one or more photovoltaic cells 210a, 210b, and 210c. In further implementations, some electronic devices may have higher peak power requirements that are larger than, for example, the Bluetooth low energy device. For these devices, the energy device 100 may optionally include an energy storage module 300, as illustrated in FIG. 3. In some implementations, the energy storage module 300 may be configured to accumulate or store sufficient power (e.g., charge) until a peak power for the electronic device is stored in store the energy storage module 300. The energy storage module 300 may be, for example, a rechargeable cell, capacitor, battery, or similar energy storage element. Thus, the energy storage module 300 may receive the harvested energy from the solar module 105 in order to store the peak power for the electronic device. As such, in some implementations, the energy device having the storage module 300 may function as a rechargeable energy device.

Figure 4A:
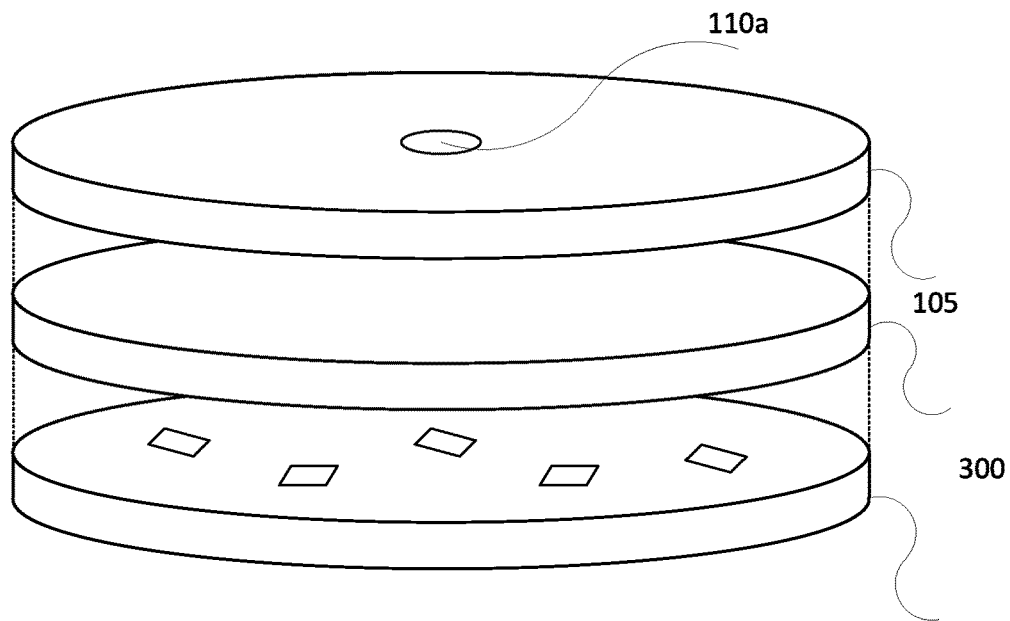
FIGS. 4A and 4B illustrate other examples of energy devices, in accordance with aspects of this disclosure.
Figure 4B:
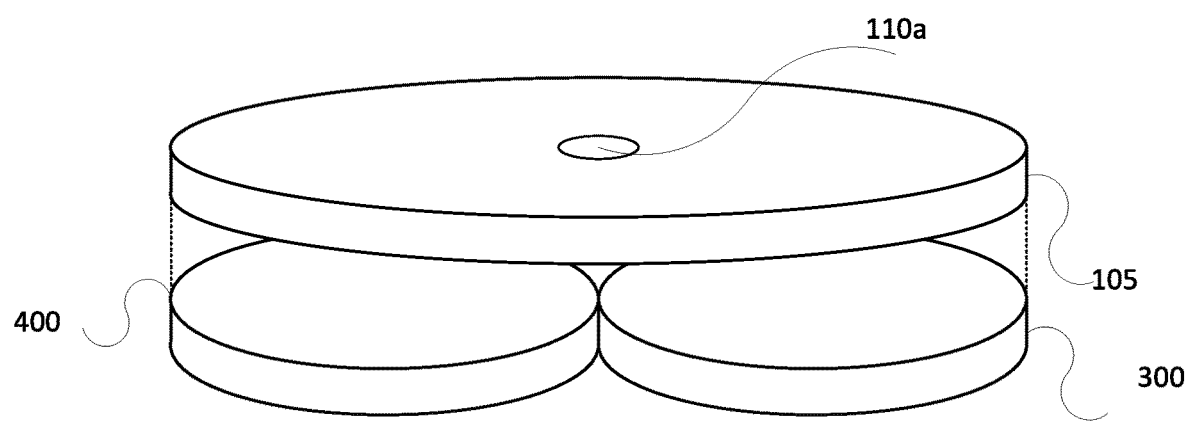

In another example, as illustrated in FIGS. 4A and 4B, the energy device 100 may optionally include a power management module 400 configured to control the flow of energy between the solar module 105 and an external circuit of the electronic device. In further examples, the power management circuit 400 may be configured to control the flow of energy between the solar module 105, the energy storage module 300, and the external circuit of the electronic device. To achieve this, the power management circuit 400 may be configured to transform impedance in a way to maximize or control power transfer between two or more of the solar module 105, the energy storage module 300, and the external circuit of the electronic device.

Figure 9:
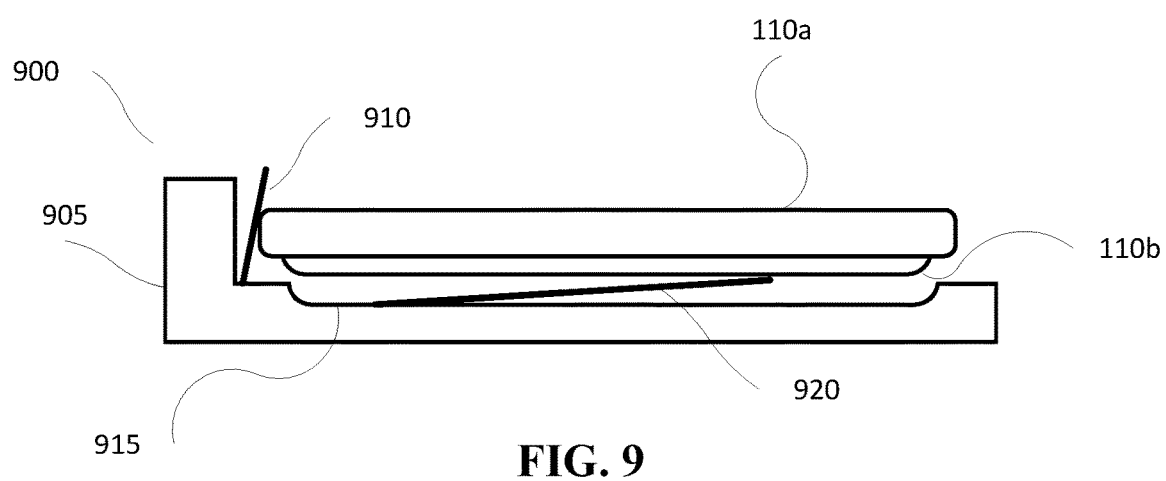
FIG. 9 illustrates another example of a coin-cell holder, in accordance with aspects of this disclosure.

In accordance with the description provided above in connection with FIGS. 1A-4B, the present disclosure describes, in one example, an energy device (e.g., energy device 100) that includes a solar module (e.g., solar module 105) having a form factor configured to be inserted into and to match an inner portion of a coin-type cell holder (see e.g., FIGS. 6A and 6B) of an electronic device, the solar module including: at least one photovoltaic cell (e.g., photovoltaic cells 210a, 210b, and 210c) configured to capture energy from ambient light and a pair of electrodes (e.g., electrodes 110a, 110b). In some implementations, at least one electrode of the electrodes is aligned with a contact of the coin-type cell holder such that the at least one electrode provides the electric energy to the electronic device. In further implementations, a side portion of the solar module is in contact with the coin-type cell holder such that the side portion of the solar module provides the electric energy to the electronic device (as illustrated in FIG. 9).

In another aspect, the solar module includes a converter module (e.g., converter module 220) coupled to the at least one photovoltaic cell and configured to convert the ambient light energy into the electric energy.

In yet another aspect, the energy device may be cylindrically shaped to match a curved shape of the inner portion of the coin-type cell holder. For example, the energy device may have a diameter that is about 24 mm and a thickness that is about 5 mm. In another example, the energy device may have a diameter of about 20 mm and a thickness of about 3.3 mm.

Figure 7A:
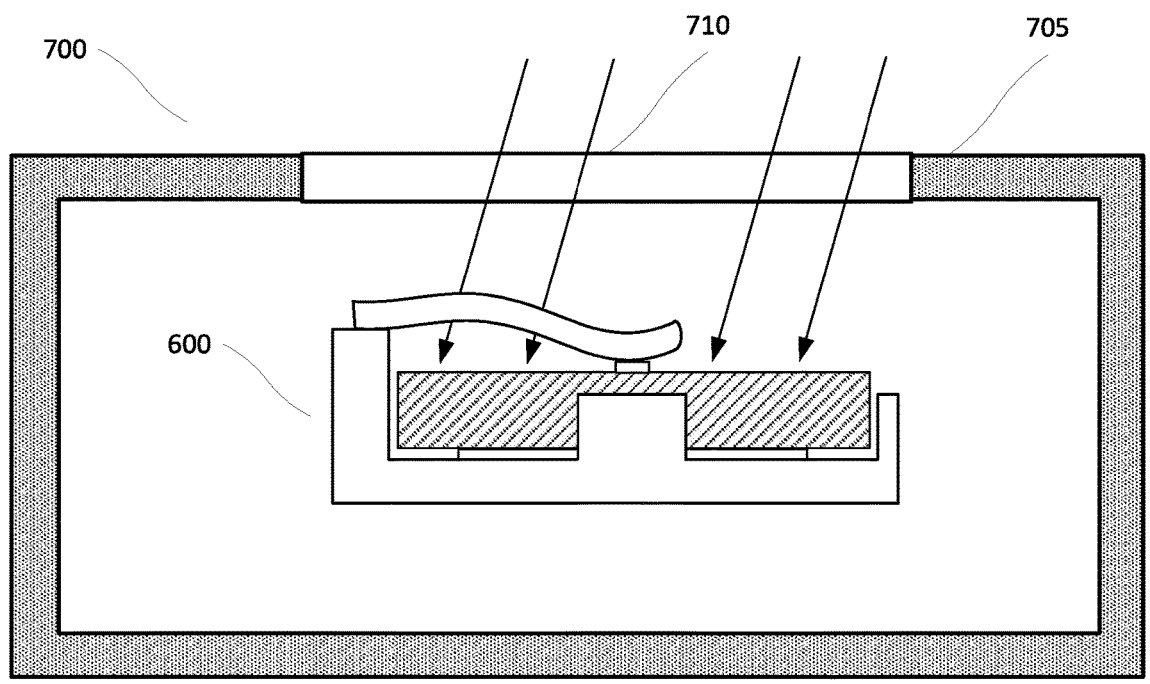
FIGS. 7A and 7B illustrate examples an energy device used within an electronic device, in accordance with aspects of this disclosure.
Figure 7B:
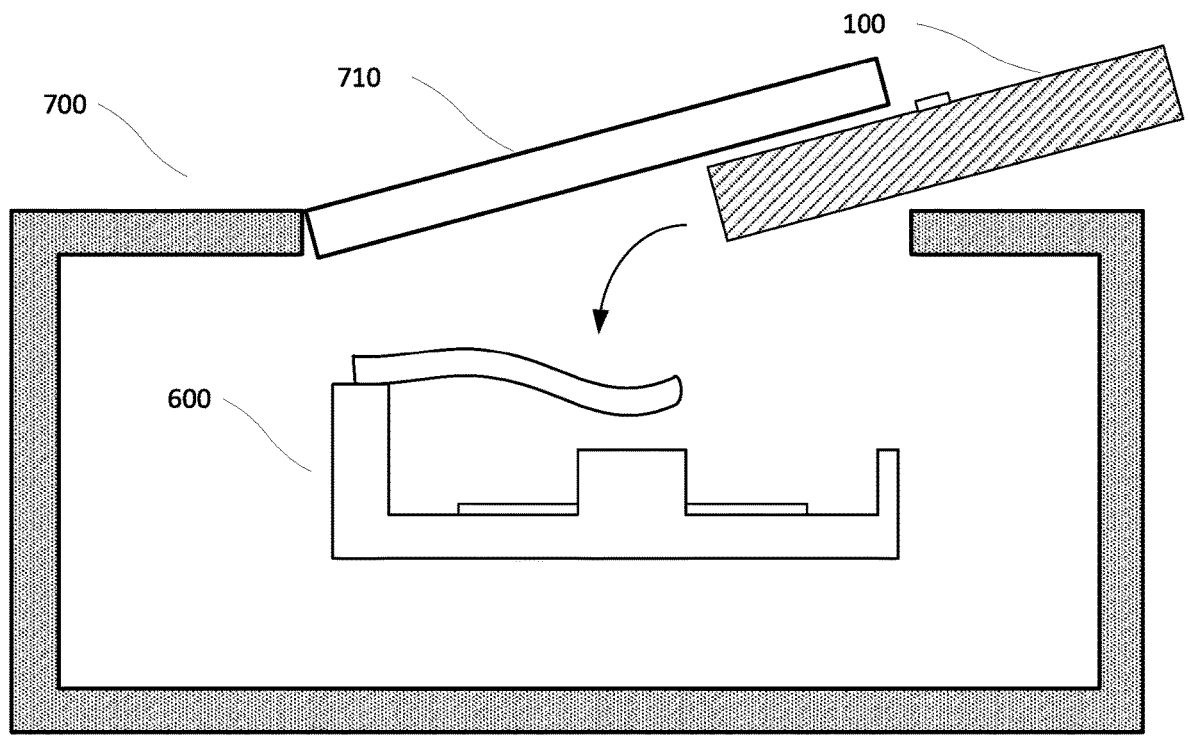

In another aspect, the at least one photovoltaic cell of the solar module may be positioned to face the ambient light energy when the solar module is inserted into and matched to the inner portion of the coin-type cell holder of the electronic device (see e.g., FIGS. 7A and 7B).

In another aspect, the energy device may include an energy storage module (e.g., energy storage module 300) coupled to the solar module and configured to store a charge produced from the ambient light energy captured by the at least one photovoltaic cell. The energy storage module may be stackable below the solar module with electrical connectivity to the solar module (see e.g., FIGS. 3 and 4A-B) and may have the same shape as the solar module so that combined with the solar module they have the form factor to be inserted into and match the inner portion of the coin-type cell holder of the electronic device. The energy storage module may be configured to provide the stored charge as the electric energy to the electronic device. Moreover, the energy storage module may include one or more energy storage elements, and each of the energy storage elements may be one of a rechargeable cell, a capacitor, or a battery.

In yet another aspect, the energy device may include a power management module (e.g., power management module 400) coupled to the solar module and configured to control a flow of the electric energy produced by the energy device to one or more electronic elements of the electronic device. In an example, the one or more electronic elements of the electronic device include a microcontroller (or controller) of the electronic device. The power management module may be stackable below the solar module with electrical connectivity to the solar module (see e.g., FIG. 4A) and may have the same shape as the solar module so that combined with the solar module they have the form factor to be inserted into and match the inner portion of the coin-type cell holder of the electronic device. In some implementations, the energy storage element 300 and the power management module 400 may be located side-by-side to one another in a manner that the combination of the energy storage element 300 and the power management module 400 stacks under the solar module (see e.g., FIG. 4B).

In another aspect, the energy device may include both the energy storage module and the power management module, in which case the energy storage module and the power management module may be stackable below the solar module with electrical connectivity between them and the solar module, and have the same shape as the solar module so that combined with the solar module they have the form factor to be inserted into and match the inner portion of the coin-type cell holder of the electronic device. When the solar module, the energy storage module, and the power management module are stackable with the solar module at the top, the energy storage module in the middle, and the power management module at the bottom, or with the solar module at the top, the power management module in the middle, and the energy storage module at the bottom. Moreover, each of the solar module, the energy storage module, and the power management module may include a circuit board or substrate having a shape that matches a curved shape of the inner portion of the coin-type cell holder, and wherein each of the circuit boards or substrates includes alignments or guides to properly position the solar module, the energy storage module, and the power management module when stacked together.

Figure 5:
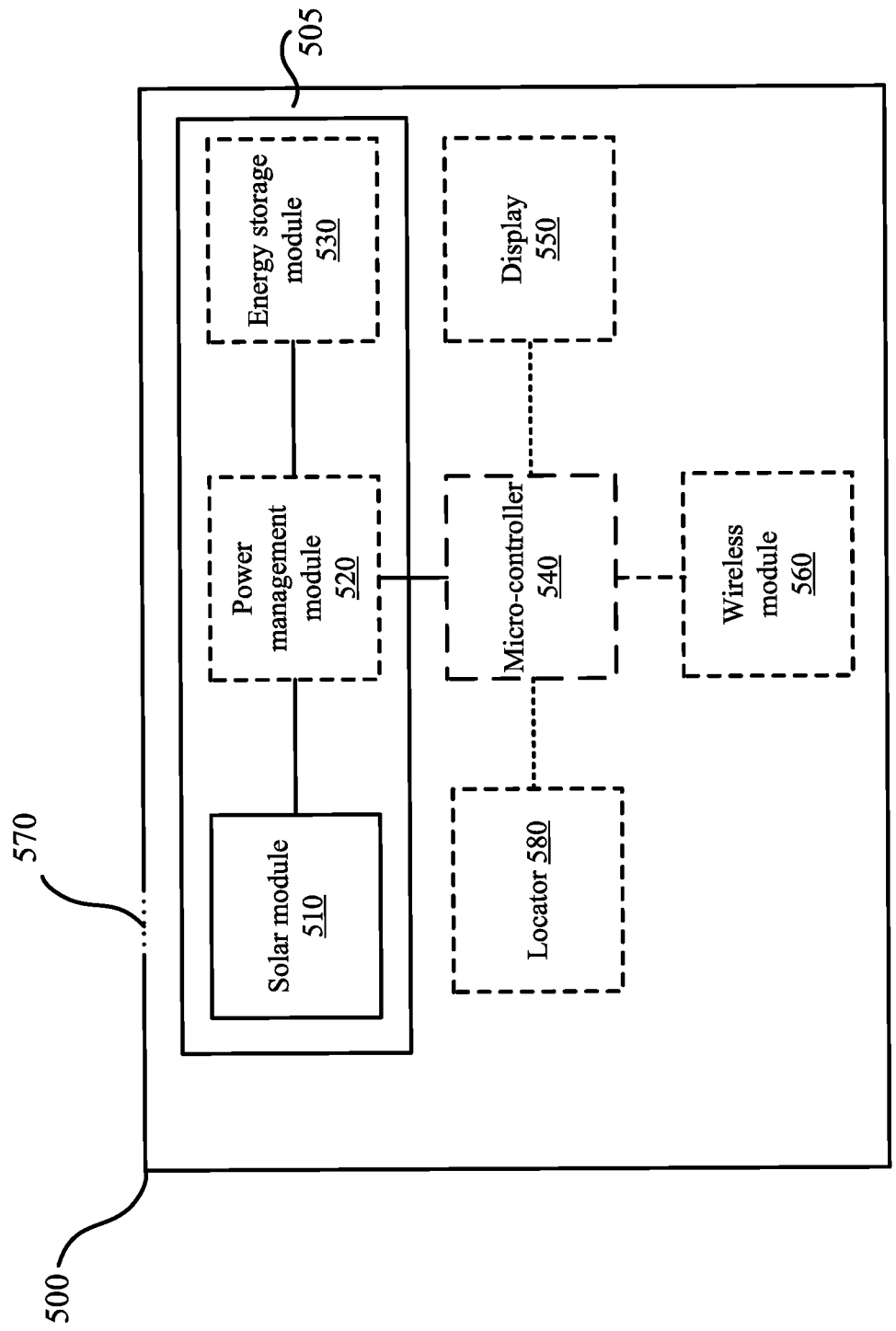
FIG. 5 illustrates a block diagram that illustrates an example architecture of an electronic device, in accordance with aspects of this disclosure.

FIG. 5 illustrates a block diagram that illustrates an example architecture of an electronic device, in accordance with aspects of this disclosure. Some of the features or components of the example electronic device 500 have been described above, however, the electronic device 500 represents one possible implementation of those features or components. Optional components in this implementation may be shown by dashed lines.

The electronic device 500 may include an energy device 505 (see, e.g., the energy device 100 shown in FIG. 1A). The energy device 505 may include a solar module 510 including at least one photovoltaic cell (see, e.g., photovoltaic cells 210a, 210b, and 210c in FIG. 2) to capture ambient light energy, and a converter module (see, e.g., converter module 220 in FIG. 2) to convert the ambient light to electrical energy. The energy device 505 may also include a power management module 520 (see, e.g., power management module 400 in FIGS. 4A and 4B) and an energy storage module 530 (see, e.g., energy storage module 300 in FIG. 3).

The electronic device 500 may also optionally include a microcontroller 540 to receive the electric energy from the energy device 505 and to control one or more operations of the electronic device 500. The electronic device 500 may optionally include a display 550 coupled to the microcontroller 350. The electronic device 500 may further include a wireless module 560 coupled to the microcontroller 540. In some implementations, the microcontroller 540 may be programmable via the wireless module 560. The wireless module 560 may be configured to support one or more wireless standards including Wi-Fi, Bluetooth, ZigBee, or WiMax. The electronic device 500 may further include a locator 580 coupled to the microcontroller 540 and configured to identify a geographical position or location of the electronic device 500. In some implementations, the locator 580 may be a global positioning system locator that supports global position systems, including GPS, Galileo, or GLONASS global navigation satellite systems.

In further implementations, the electronic device 500 may further include a transparent opening 570 exposing the energy device to the ambient light. For example, in some implementations, the transparent opening 570 may be fully transparent allowing 100% of the ambient light to pass through to the energy device. In further implementations, the transparent opening 570 may be partially transparent allowing less 100% of the ambient light to pass through to the energy device. The solar module 510 may be positioned such that the ambient light that passes through the transparent opening 570 is received by the solar module 510 for capturing the energy from the ambient light. In some implementations, the transparent opening 570 may be aligned with the solar module 510 such that all of the ambient light that passes through the transparent opening 570 is received by the solar module 510.

Figure 6A:
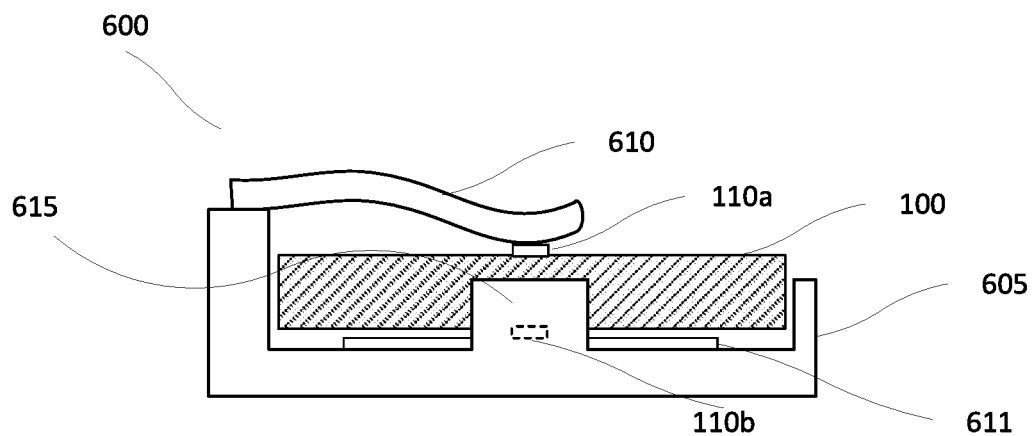
FIGS. 6A and 6B illustrate examples of a coin-cell holder, in accordance with aspects of this disclosure.
Figure 6B:
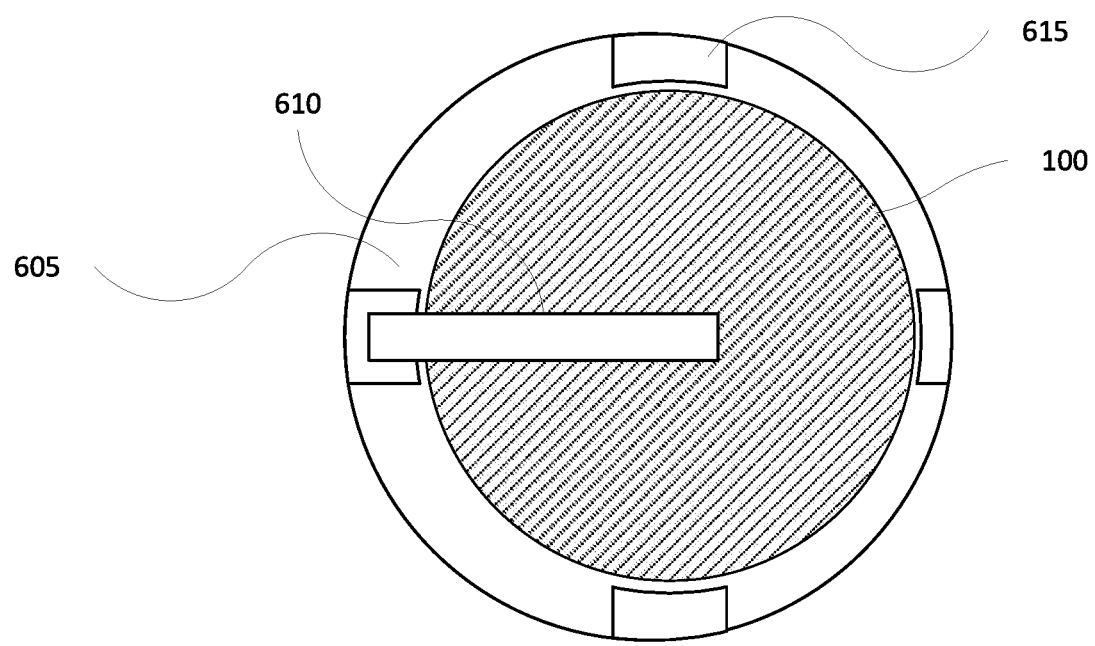

FIGS. 6A and 6B illustrate an example coin-cell holder, in accordance with aspects of this disclosure. For example, in some implementations, a coin-type cell holder 600 may include a base 605 for holding, for example, an energy device, such as the energy device 100 shown in FIG. 1A. As shown in FIG. 6A, the base 605 may include multiple raised segments 615 that may prevent the energy device from moving laterally off the coin-cell holder 600. In some implementations, the coin-type cell holder 600 may also include an arm 610 for holding the energy device in place. The arm 610 may provide a first one of the contacts of the coin-type cell holder 600, while a contact 611 may provide a second contact of the coin-type cell holder 600.

As described above, the energy device 100 that is inserted into the coin-type cell holder 600 may include a solar module 105 by itself or with one or both of the energy storage module 300 or the power management module 400.

FIGS. 7A and 7B illustrate examples of an energy device used within an electronic device, in accordance with aspects of this disclosure. In this example, an electronic device 700, which may be an example of the electronic device 500 in FIG. 5, has a housing 705 within which the energy device 100 and the coin-type cell holder 600 are placed, and where the housing 705 has a transparent portion 710 (e.g., transparent opening 570) for exposing the at least one photovoltaic cell of the solar module to the ambient light (represented by arrows). The transparent portion 710 may be, for example, a lid or cover through which the energy device 100 and/or the coin-type cell holder 600 may be inserted inside the electronic device 700.

FIG. 9 illustrates an example coin-cell holder, in accordance with aspects of this disclosure. For example, in some implementations, a coin-type cell holder 900 may include a base 905 for holding, for example, an energy device, such as the energy device 100 shown in FIG. 1A and the energy device shown in FIG. 8 having an electrode 110a on the top and an electrode 110b on the bottom. As shown in FIG. 9, the base 905 may include a curved portion 915 that may prevent the energy device from moving laterally off the coin-cell holder 900. In some implementations, the coin-type cell holder 900 may also include a first arm 910 for holding the energy device in place and/or providing a first contact of the coin-type cell holder 900 to the energy device and a second arm 920 that may provide a second contact of the coin-type cell holder 900 to the energy device.

The above description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Implementations were chosen and described in order to best describe certain principles and practical applications, thereby enabling others skilled in the relevant art to understand the subject matter, the various implementations, and the various modifications that are suited to the particular uses contemplated. It is therefore intended that the scope of the techniques described herein be limited not by this Detailed Description, but rather by any claims that issue on an application based hereon. Accordingly, the disclosure of various implementations is intended to be illustrative, but not limiting, of the scope of the embodiments, which is set forth in the following claims.

What is claimed is:

1. A energy device comprising:
   a solar module having a form factor configured to be inserted into and to match an inner portion of a coin-type cell holder of an electronic device, the solar module including at least one photovoltaic cell configured to capture energy from ambient light;
   a pair of electrodes, wherein the energy device is configured to provide, to the electronic device via contact with the coin-type cell holder, electric energy produced by the energy device from the ambient light energy, and
   an energy storage module coupled to the solar module and configured to store a charge produced from the ambient light energy captured by the at least one photovoltaic cell,
   wherein the coin-type cell holder includes an arm that includes one of the pair of contacts, and that is constructed to apply force and hold the energy device, and wherein the solar module and the energy storage module include a same shape and diameter.

2. The energy device of claim 1, wherein the solar module further includes a converter module coupled to the at least one photovoltaic cell and configured to convert the ambient light energy into the electric energy.

3. The energy device of claim 1, wherein the energy device is cylindrically shaped to match a curved shape of the inner portion of the coin-type cell holder.

4. The energy device of claim 1, wherein the at least one photovoltaic cell of the solar module is positioned to face the ambient light energy when the solar module is inserted into and matched to the inner portion of the coin-type cell holder of the electronic device.

5. The energy device of claim 1, wherein the energy device is a rechargeable energy device.

6. The energy device of claim 5, wherein the energy storage module is configured to be stackable below the solar module with electrical connectivity to the solar module and has the same shape as the solar module so that combined with the solar module they have the form factor to be inserted into and match the inner portion of the coin-type cell holder of the electronic device.

7. The energy device of claim 5, wherein the energy storage module is configured to provide the stored charge as the electric energy to the electronic device.

8. The energy device of claim 5, wherein the energy storage module includes one or more energy storage elements, and each of the energy storage elements is one of a rechargeable cell, a capacitor, or a battery.

9. The energy device of claim 1, further comprising a power management module coupled to the solar module and configured to control a flow of the electric energy produced by the energy device to one or more electronic elements of the electronic device.

10. The energy device of claim 9, wherein the one or more electronic elements of the electronic device include a microcontroller of the electronic device.

11. The energy device of claim 9, wherein the power management module is configured to be stackable below the solar module with electrical connectivity to the solar module and has the same shape as the solar module so that combined with the solar module they have the form factor to be inserted into and match the inner portion of the coin-type cell holder of the electronic device.

12. The energy device of claim 5, further comprising
a power management module coupled to the solar module and configured to control a flow of the electric energy produced by the rechargeable energy device to one or more electronic elements of the electronic device,
wherein the energy storage module and the power management module are stackable below the solar module with electrical connectivity between them and the solar module, and have the same shape as the solar module so that combined with the solar module they have the form factor to be inserted into and match the inner portion of the coin-type cell holder of the electronic device.

13. The energy device of claim 12, wherein the solar module, the energy storage module, and the power management module are stackable with the solar module at a top, the energy storage module in a middle, and the power management module at a bottom, or with the solar module at the top, the power management module in the middle, and the energy storage module at the bottom.

14. The energy device of claim 12, wherein each of the solar module, the energy storage module, and the power management module includes a circuit board or substrate having a shape that matches a curved shape of the inner portion of the coin-type cell holder, and wherein each of the circuit boards or substrates includes alignments or guides to properly position the solar module, the energy storage module, and the power management module when stacked together.

15. The energy device of claim 1, wherein at least one electrode of the pair of electrodes is aligned with a contact of the coin-type cell holder such that the at least one electrode provides the electric energy to the electronic device.

16. The energy device of claim 1, wherein a side portion of the solar module is in contact with the coin-type cell holder such that the side portion of the solar module provides the electric energy to the electronic device.

17. An electronic device comprising:
a coin-type cell holder having an inner portion;
an energy device having a form factor configured to be inserted into and to match the inner portion of the coin-type cell holder, the energy device including:
a solar module having at least one photovoltaic cell configured to capture energy from ambient light;
a pair of electrodes, wherein the energy device is configured to provide, to the electronic device via contact with the coin-type cell holder, electric energy produced by the energy device from the ambient light energy;
an energy storage module coupled to the solar module and configured to store a charge produced from the ambient light energy captured by the at least one photovoltaic cell;
a housing within which the energy device and the coin-type cell holder are placed, the housing having a transparent portion for exposing the at least one photovoltaic cell of the solar module to the ambient light; and
a microcontroller configured to control one or more operations of the electronic device, the microcontroller being powered by the electric energy provided by the energy device,
wherein the coin-type cell holder includes an arm that includes one of the pair of contacts, and that is constructed to apply force and hold the energy device, and
wherein the solar module and the energy storage module includes a same shape and diameter.

18. The electronic device of claim 17, wherein the solar module further includes a converter module coupled to the at least one photovoltaic cell and configured to convert the ambient light energy into the electric energy.

19. The electronic device of claim 17, wherein the energy device is cylindrically shaped to match a curved shape of the inner portion of the coin-type cell holder.

20. The electronic device of claim 17, wherein the at least one photovoltaic cell of the solar module is positioned to face the ambient light energy when the energy device is inserted into and matched to the inner portion of the coin-type cell holder of the electronic device.

21. The electronic device of claim 17, wherein the energy device is a rechargeable energy device.

22. The electronic device of claim 21, wherein the energy storage module is configured to be stackable below the solar module with electrical connectivity to the solar module and has the same shape as the solar module so that combined with the solar module, the rechargeable electronic device has the form factor to be inserted into and to match the inner portion of the coin-type cell holder of the electronic device.

23. The electronic device of claim 21, wherein the energy storage module includes one or more energy storage elements, and each of the energy storage elements is one of a rechargeable cell, a capacitor, or a battery.

24. The electronic device of claim 17, wherein the energy device further comprises a power management module coupled to the solar module and configured to control a flow of the electric energy produced by the energy device to one or more electronic elements of the electronic device, the one or more electronic elements including the microcontroller.

25. The electronic device of claim 24, wherein the power management module is configured to be stackable below the solar module with electrical connectivity to the solar module and has the same shape as the solar module so that combined with the solar module, the energy device has the form factor to be inserted into and match the inner portion of the coin-type cell holder of the electronic device.

26. The electronic device of claim 21, wherein the energy device further comprises
a power management module coupled to the solar module and configured to control a flow of the electric energy produced by the rechargeable energy device to one or more electronic elements of the electronic device, wherein the energy storage module and the power management module are configured to be stackable below the solar module with electrical connectivity between them and the solar module, and have the same shape as the solar module when combined with the solar module the rechargeable energy device has the form factor to be inserted into and match the inner portion of the coin-type cell holder of the electronic device.

27. The electronic device of claim 26, wherein the solar module, the energy storage module, and the power management module are stackable with the solar module at a top, the energy storage module in a middle, and the power management module at a bottom, or with the solar module at the top, the power management module in the middle, and the energy storage module at the bottom.

28. The electronic device of claim 26, wherein each of the solar module, the energy storage module, and the power management module includes a circuit board or substrate having a shape that matches a curved shape of the inner portion of the coin-type cell holder, and wherein each of the circuit boards or substrates includes alignments or guides to properly position the solar module, the energy storage module, and the power management module when stacked together.

29. The electronic device of claim 17, wherein the transparent portion of the housing is a moveable portion through which, when removed or opened, the energy device is inserted into or retrieved from the coin-type cell holder.

30. The electronic device of claim 17, wherein at least one electrode of the pair of electrodes is aligned with a contact of the coin-type cell holder such that the at least one electrode provides the electric energy to the electronic device.

31. The electronic device of claim 17, wherein a side portion of the solar module is in contact with the coin-type cell holder such that the side portion of the solar module provides the electric energy to the electronic device.

32. The electronic device of claim 17, wherein the transparent portion of the housing is aligned with the at least one photovoltaic cell of the solar module such that all of the ambient light that passes through a transparent opening is received by the at least one photovoltaic cell.

* * * * *